United States Patent [19]

Yabusaki et al.

[11] Patent Number: 4,777,443

[45] Date of Patent: Oct. 11, 1988

[54] INSPECTION APPARATUS BASED ON NUCLEAR MAGNETIC RESONANCE

[75] Inventors: Masao Yabusaki, Tokyo; Etsuji Yamamoto, Akishima; Takashi Onodera, Koganei; Yukiko Ogura; Hideaki Nakane, both of Hachioji; Shigeru Matsui, Koganei; Hideki Kohno, Tokyo, all of Japan

[73] Assignee: Hitachi, Ltd., Tokyo, Japan

[21] Appl. No.: 119,489

[22] Filed: Nov. 12, 1987

[30] Foreign Application Priority Data

Nov. 14, 1986 [JP] Japan .................. 61-271237
Nov. 14, 1986 [JP] Japan .................. 61-271238

[51] Int. Cl.⁴ .................................. G01R 33/20
[52] U.S. Cl. ................................. 324/322
[58] Field of Search ............ 324/307, 309, 322, 301, 324/248; 307/306

[56] References Cited

U.S. PATENT DOCUMENTS 4,390,840 6/1983 Ganssen et al. ............ 324/309
4,585,999 4/1986 Hilbert et al. ............. 307/306
4,733,182 3/1988 Clarke et al. ............. 324/301

OTHER PUBLICATIONS

Hilbert, C. et al., "Nuclear Quadrupole Resonance Detected at 30 MHZ with a DC Superconducting Interference Device" Appl. Phys. Lett. 47(6) 15 Sep. 1985.

*Primary Examiner*—Tom Noland
*Assistant Examiner*—Lawrence G. Fess
*Attorney, Agent, or Firm*—Antonelli, Terry & Wands

[57] ABSTRACT

Disclosed in a nuclear magnetic resonance (NMR) based inspection apparatus using an SQUID flux meter for detecting a small NMR signal, in which a receiving coil for receiving the NMR signal from an object is connected to a mixer, which mixes a reference high-frequency signal with the NMR signal so that the NMR signal is reduced to a low-frequency signal having a differential component of frequencies of both signals, and the low-frequency signal is applied to the input coil of the SQUID flux meter so that it is converted into a voltage signal. The mixer circuit includes Schottky diodes operative at a liquid helium temperature or Josephson junctions, and the portions of apparatus from the reception coil up to the SQUID flux meter are operated in a superconductive state at a liquid helium temperature.

6 Claims, 2 Drawing Sheets

INSPECTION APPARATUS BASED ON NUCLEAR MAGNETIC RESONANCE

BACKGROUND OF THE INVENTION

This invention relates to an inspection apparatus based on nuclear magnetic resonance (NMR), and particularly to an inspection apparatus based on nuclear magnetic resonance and suitable for high sensitivity measurement using a superconducting quantum interference device (SQUID) flux meter.

A conventional NMR-based inspection apparatus using an SQUID flux meter is described in publication, for example, Applied Physics Letters, Vol. 47, No. 6, 1985, pp. 637–639. This apparatus operates in such a way that an electromagnetic wave for inducing the nuclear magnetic resonance is applied to an object using a known method and an NMR signal (also called "FID signal") from the object is received by a high-selectivity LC resonance circuit consisting of a receiving coil and a resonating capacitor soaked in liquid helium and detected sensitivity with an SQUID flux meter. The detected signal is amplified with an amplifier and then mixed down into a low-frequency signal using a signal provided by a high-frequency oscillator.

The above conventional technique is intended for a small flux below the quantum flux $\phi_o$ of the SQUID flux meter, however, the NMR signal is not necessarily below the quantum flux $\phi_o$. Moreover, detecting a flux above the quantum flux $\phi_o$ necessitates a feedback circuit, which is difficult to operate in a high frequency region. The above publication does not recognize the problem that the apparatus eventually operates only in a low frequency region.

SUMMARY OF THE INVENTION

An object of this invention is to provide an NMR-based inspection apparatus which enables the SQUID flux meter to operate at a low frequency and is capable of high sensitivity detection for the NMR signal.

The invention resides in the arrangement including a mixer which mixes the reception signal in the LC resonance circuit made up of a receiving coil and resonating capacitor with the high-frequency reference signal so that the NMR signal is mixed down into a low-frequency signal, and an SQUID flux meter which detects sensitively the low-frequency signal.

DESCRIPTION OF THE PREFERRED EMBODIMENTS

Embodiments of this invention will now be described in detail with reference to the drawings.

Figure 1:
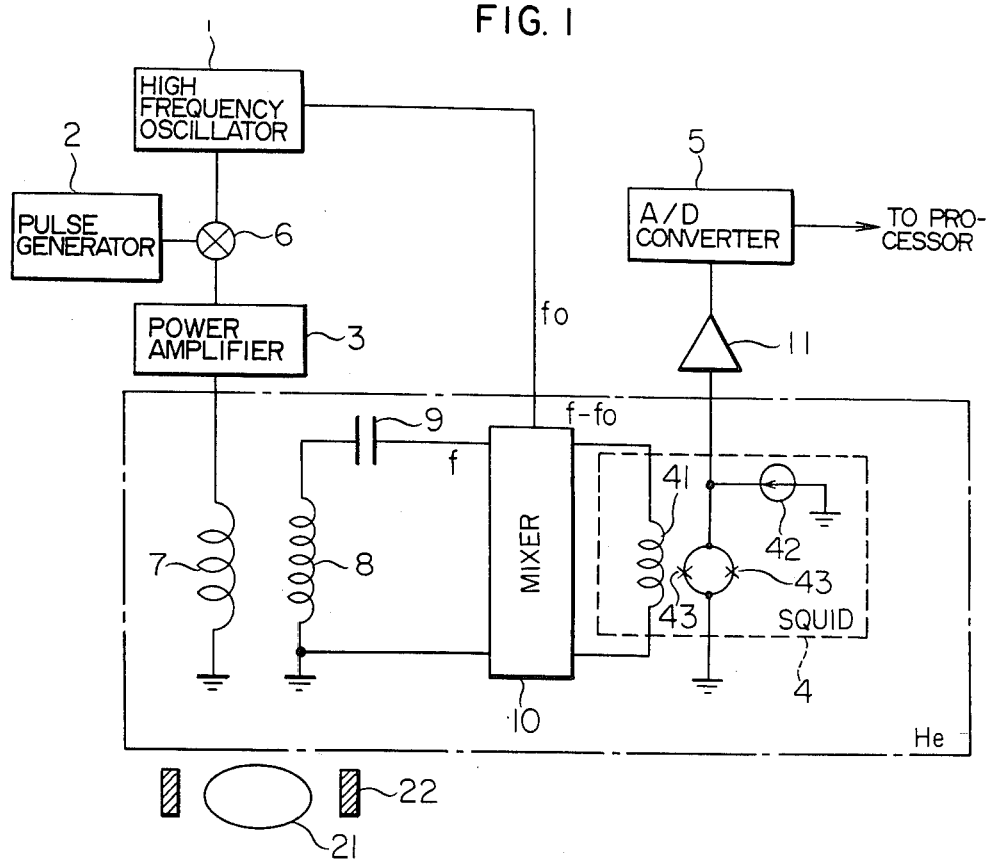
FIG. 1 is a block diagram showing an embodiment of this invention.

FIG. 1 shows in block diagram the detection unit of the NMR-based inspection apparatus embodying the present invention. In the figure, indicated by 1 is a high-frequency oscillator which generates a signal with a frequency of $f_o$, and 2 is a pulse generator. The high-frequency signal generated by the oscillator 1 is fed through a gate 6 which is controlled by the output of the pulse generator 2 and received by a power amplifier 3. The power amplifier 3 has its output terminal connected to a transmission coil 7, by which a high-frequency magnetic field is applied to an object 21. In this embodiment, the object is placed in the magnetic field of about 2T produced by a magnetic field generator 22, and the application of high-frequency magnetic field excites the nuclear spin of hydrogen's atomic nucleus (proton) in the object. Accordingly, the frequency $f_o$ of the high-frequency signal is set to the nuclear magnetic resonance frequency (approx. 85 MHz).

The NMR signal (FID signal) produced by the excitation of the object is received by a receiving coil 8, which is connected with a resonating capacitor 9 and a mixer 10 to form a loop. The mixer 10 is supplied with the high-frequency signal of $f_o$ from the oscillator 1, and the received NMR signal is mixed down into a low-frequency signal. The NMR signal has its frequency f varied depending on the distribution of magnetic field in which the object is placed and on the chemical coupling of hydrogen atoms in the object, and it distributes in a 85 MHz band. Accordingly, the mixed down low-frequency signal has a frequency expressed as $f-f_o$, and it generally extends in a frequency band from ones to tens killo-Hertz. This low-frequency signal is detected sensitively by an SQUID flux meter 4, which converts the signal into a voltage signal.

Indicated by 41 is an input coil of the SQUID flux meter, 43 are Josephson junctions, and 42 is a d.c. bias current source. The detected voltage signal is amplified by an amplifier 11 and then converted into a digital signal by an A/D converter 5 so that it is processed in the processor. The transmission coil 7, receiving coil 8, resonating capacitor 9, mixer 10 and SQUID flux meter 4 are all operating in a superconductive state by being soaked in a coolant such as liquid helium, whereby the thermal noise can be reduced effectively.

Figure 2:
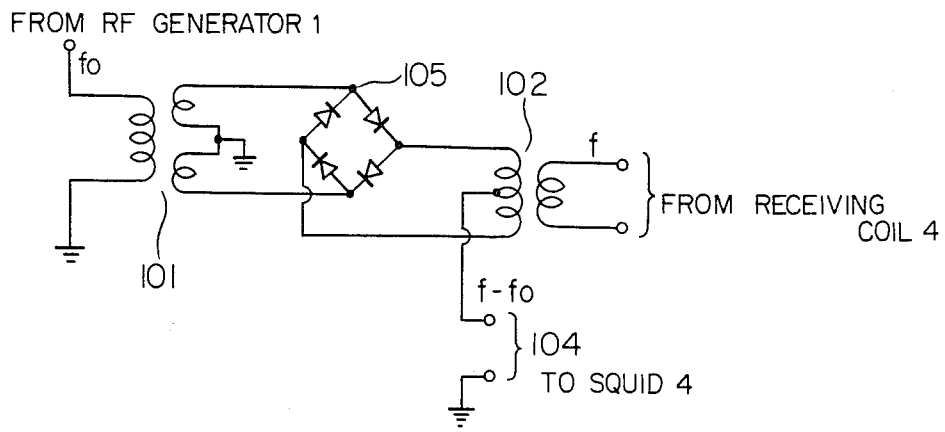
FIGS. 2 and 3 are schematic diagrams of the functional block 10 in FIG. 1.

FIG. 2 shows, as an example, the circuit arrangement of the mixer 10 useful for the above embodiment of the invention. This circuit is known as a double balanced mixer, with its high-frequency transformer 101 being supplied on the primary winding with the high-frequency signal of $f_o$ from the oscillator 1. Another high-frequency transformer 102 has its primary winding connected to the receiving coil 8 and resonating capacitor 9 in FIG. 1 to form a loop, and it is supplied with the NMR signal with frequency f. These radio-frequency transformers have their secondary windings connected to diodes 105 in bridge configuration, so that a low-frequency signal with a differential frequency $f-f_o$ is obtained between the center taps of the secondary windings, i.e., between output terminals 104. It should be noted that these radio-frequency transformers and associated wirings are all made of superconductor, and the four diodes 105 in bridge configuration are ones operative at a temperature of liquid helium, e.g., Schottky diodes or super Schottky diodes using GaAs.

Figure 3:
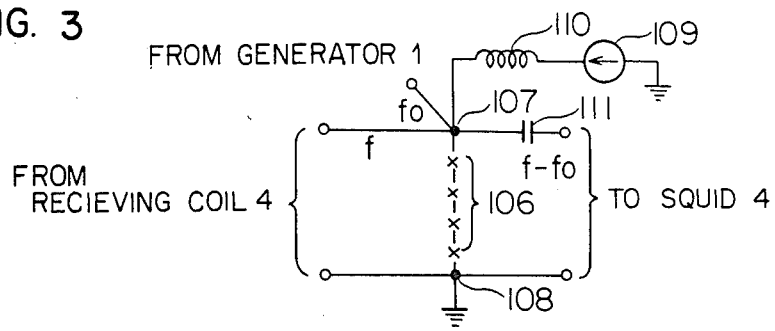

FIG. 3 shows, as another example, the circuit arrangement of the mixer 10. A serial connection of Josephson junctions 106 has one end 107 connected through a high-frequency choke coil 110 to a d.c. bias current source 109, and another end 108 grounded directly. Through these ends 107 and 108 the serial Josephson junctions are in connection with the receiving coil 8 and resonating capacitor 9 in a loop fashion. The mixer 10 is provided with a terminal 107, to which is supplied the high-frequency signal of $f_o$ from the oscillator 1. A low-frequency component, which is a differential frequency $f-f_o$ of the high-frequency signal and NMR signal, is obtained through a coupling capacitor 111 connected to the terminal 107.

According to the foregoing embodiment, the NMR signal which has been converted to a low-frequency signal of the order of ones to tens killo-Hertz is applied to the SQUID flux meter 4, whereby it operates stably at a low frequency. In addition, the SQUID flux meter can have a low-frequency output signal, which advantageously relaxes the requirement of the amplifier. Especially, it becomes possible to detect the NMR signal in conditions of high sensitivity and high S/N ratio by increasing the magnetic field strength applied to the object, and the inventive scheme can cope with the resulting increase in the frequency of the NMR signal.

Figure 4:
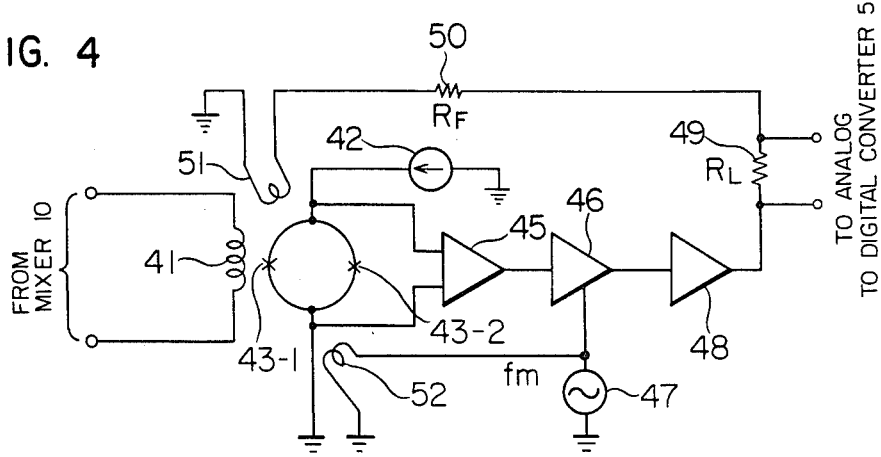
FIG. 4 is a schematic diagram of another embodiment of this invention.

FIG. 4 shows another example of the SQUID flux meter which can be used in place of the functional blocks 4 and 11 in FIG. 1. This is an SQUID flux meter of the feedback type, in which a loop of two Josephson junctions 43-1 and 43-2 couples magnetically with a feedback coil 51 and modulating coil 52, as well as the input coil 41. The modulating coil 52 is supplied with a frequency $f_m$ from a modulation high-frequency signal source 47, so that the low-frequency NMR signal entered through the input coil 41 is modulated by the high-frequency signal of $f_m$. The signal across the loop ends is fed through an amplifier 45 to a lock-in amplifier 46, by which a signal with a specific phase is extracted from the high-frequency signal of $f_m$, i.e., a demodulated signal is produced. The extracted signal is applied to the feedback coil 51 by way of a load resistor $R_L$ and feedback resistor $R_F$. The feedback coil 51 produces a magnetic flux, which acts to cancel the magnetic flux of the input coil 41, and consequently a voltage output in accordance with the input low-frequency NMR signal appears across the load resistor $R_L$. This circuit allows the measurement of an NMR signal which generates a magnetic flux in excess of the quantum flux for the sole SQUID flux meter. Although this circuit has a low measurable frequency limit due to the limited response of the feedback circuit, it becomes applicable to NMR apparatus of high magnetic field, on the basis of conversion for the NMR signal into a low-frequency signal, by being used in the circuit shown in FIG. 1.

Figure 5:
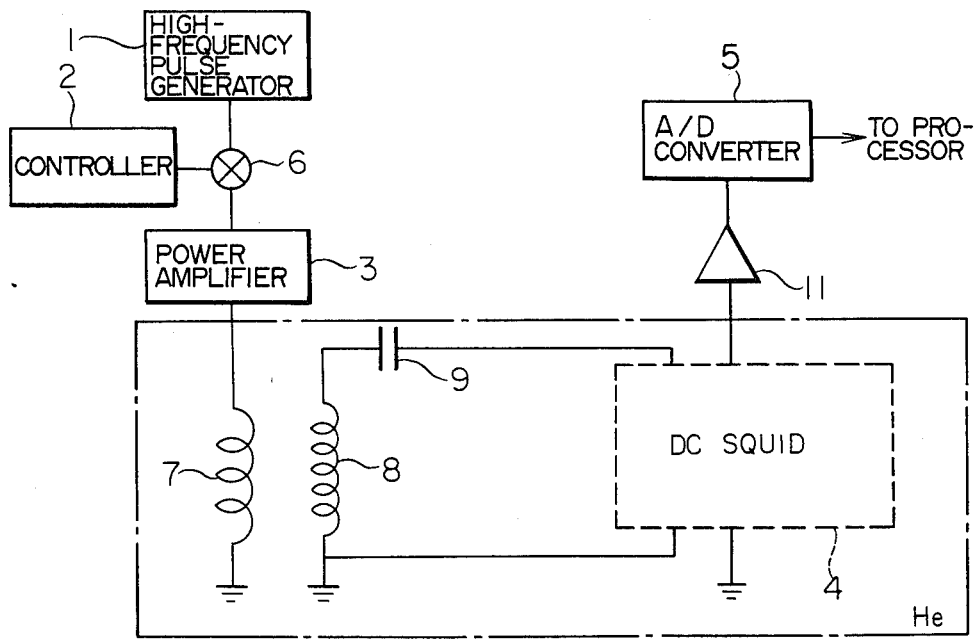
FIG. 5 is a block diagram showing still another embodiment of this invention.

FIG. 5 shows another embodiment of this invention. In the preceding embodiment shown in FIGS. 1 through 4, the NMR signal is reduced to a low-frequency signal so that the SQUID flux meter is operative for detection. On the other hand, the NMR signal has its frequency lowered when the application magnetic field strength is reduced, and on this account high-sensitivity detection of NMR signal with the SQUID flux meter is made possible without using a frequency converting mixer.

In the embodiment of FIG. 5, the NMR signal received by the receiving coil 8 is entered directly to the SQUID flux meter 4 and, after being amplified with an amplifier 11, the output is converted into a digital signal with an A/D converter 3. The remaining functional components are equivalent to those shown in FIG. 1.

As a magnetic field applied to the object, a terrestrial magnetism is used, for example. In this case, the magnetic field strength is about 0.5 gauss and the nuclear magnetic resonance frequency of proton is about 1.26 kHz, and the NMR signal in this frequency domain can directly undergo A/D conversion after being converted into a voltage signal with the SQUID flux meter 4. Also, in the case of using a static magnetic field generator, as in general NMR apparatus, the resonance frequency of proton can be made below 1 MHz approx. by maintaining the magnetic field strength below 240 gauss approx. This allows direct A/D conversion with a 12-bit for example or higher resolution without mixing down the signal.

Although in the foregoing embodiments a d.c. SQUID flux meter is used, the present invention is not confined to this scheme, but its technical essence is equally applicable to RF SQUID flux meters.

We claim:

1. An inspection apparatus based on nuclear magnetic resonance (NMR) comprising:
   means for exciting the nuclear spin of an object placed in a prescribed magnetic field;
   a receiving coil for receiving an NMR signal from said object;
   a high-frequency signal generator for producing a high-frequency signal with a prescribed frequency;
   a mixer for mixing said NMR signal with said high-frequency signal to convert said NMR signal into a low-frequency signal having a differential component of frequencies of said signals; and
   an SQUID flux meter having an input coil for receiving said low-frequency signal and adapted to convert a magnetic flux generated by said input coil into a voltage signal.

2. An inspection apparatus according to claim 1 further comprising an A/D converter for converting the output of said SQUID flux meter into a digital signal.

3. An inspection apparatus according to claim 1, wherein said mixture comprises a double balanced mixer including a Schottky diode which is operative at a liquid helium temperature.

4. An inspection apparatus according to claim 1, wherein said mixer comprises a Josephson junction circuit in connection with a d.c. bias current source, said receiving coil, and the output of said high-frequency signal generator.

5. An inspection apparatus according to claim 4, wherein said Josephson junction circuit comprises a comprises a serial connection of a plurality of Josephson junctions.

6. An inspection apparatus according to claim 1, wherein said SQUID flux meter comprises an SQUID flux meter of a feedback type including a modulation means for modulating the signal received by said input coil, a loop circuit made up of a plurality of Josephson junctions for detecting a modulated magnetic flux, and a feedback means which demodulates the output signal of said loop circuit and feeds back the demodulated signal as an intersecting flux to said loop circuit.

* * * * *